(12) United States Patent
Ikushima et al.

(10) Patent No.: US 10,983,174 B2
(45) Date of Patent: Apr. 20, 2021

(54) DIRECT-CURRENT ELECTRICITY LEAKAGE DETECTION DEVICE AND ELECTRICITY LEAKAGE DETECTION DEVICE

(71) Applicant: Panasonic Intellectual Property Management Co., Ltd., Osaka (JP)

(72) Inventors: Tsuyoshi Ikushima, Nara (JP); Naoki Fukuo, Shiga (JP); Tomokazu Nishigaki, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 60 days.

(21) Appl. No.: 16/462,226

(22) PCT Filed: Nov. 16, 2017

(86) PCT No.: PCT/JP2017/041190
§ 371 (c)(1),
(2) Date: May 19, 2019

(87) PCT Pub. No.: WO2018/101052
PCT Pub. Date: Jun. 7, 2018

(65) Prior Publication Data
US 2019/0331724 A1    Oct. 31, 2019

(30) Foreign Application Priority Data
Nov. 29, 2016 (JP) .............................. JP2016-231837

(51) Int. Cl.
*G01R 31/02* (2006.01)
*G01R 31/50* (2020.01)
*H03K 19/20* (2006.01)

(52) U.S. Cl.
CPC ............. *G01R 31/50* (2020.01); *H03K 19/20* (2013.01)

(58) Field of Classification Search
None
See application file for complete search history.

(56) References Cited

U.S. PATENT DOCUMENTS 9,083,241 B2 * 7/2015 Koiwai ............... H02M 1/4225
9,239,365 B2 * 1/2016 Oikawa ................. G01R 33/04
(Continued)

FOREIGN PATENT DOCUMENTS

CN  101726334 A  6/2010
CN  103178780 A  6/2013
(Continued)

OTHER PUBLICATIONS

European Search Report for corresponding European Application No. 17876956.8 dated Nov. 5, 2019.
(Continued)

*Primary Examiner* — Jermele M Hollington
(74) *Attorney, Agent, or Firm* — Renner, Otto, Boisselle & Sklar, LLP

(57) ABSTRACT

An excitation unit applies, to an excitation coil, an excitation voltage with a voltage level alternately changing between a first high voltage value higher than a reference voltage value and a first low voltage value lower than the reference voltage value. The excitation unit includes a comparison circuit and a voltage switching circuit. The comparison circuit outputs a comparison signal having a voltage level switching between a high level and a low level depending on whether a detection voltage is greater than, or equal to or less than, a threshold voltage. The voltage switching circuit switches the voltage level of the excitation voltage between the first high voltage value and the first low voltage value according to the voltage level of the comparison signal.

6 Claims, 4 Drawing Sheets

(56) References Cited

U.S. PATENT DOCUMENTS

| | | | |
|---|---|---|---|
| 10,436,620 B2* | 10/2019 | Momose | G01F 1/588 |
| 10,756,626 B2* | 8/2020 | Hu | H02M 1/38 |
| 10,809,312 B2* | 10/2020 | Ikushima | G01R 31/50 |
| 2013/0215538 A1* | 8/2013 | Gotou | H02H 3/33 |
| | | | 361/42 |
| 2015/0022153 A1 | 1/2015 | Bouchez et al. | |
| 2017/0222424 A1* | 8/2017 | Fukuo | H02H 3/33 |
| 2018/0131173 A1 | 5/2018 | Iwami | |
| 2019/0068059 A1* | 2/2019 | Hu | H02M 3/158 |
| 2019/0331725 A1* | 10/2019 | Ikushima | G01R 31/50 |

FOREIGN PATENT DOCUMENTS

| | | |
|---|---|---|
| JP | 2016-031253 A | 3/2016 |
| TW | 201104266 A | 2/2011 |
| TW | M463844 U | 10/2013 |
| WO | 2016/170731 A1 | 10/2016 |

OTHER PUBLICATIONS

International Search Report and Written Opinion for corresponding App. No. PCT/JP2017/041190, dated Jan. 23, 2018.
Office Action for corresponding Chinese Patent Application No. 201780073665.7 dated Nov. 9, 2020, with English language translation.

\* cited by examiner

DIRECT-CURRENT ELECTRICITY LEAKAGE DETECTION DEVICE AND ELECTRICITY LEAKAGE DETECTION DEVICE

TECHNICAL FIELD

The present invention generally relates to a direct-current (DC) leakage detector and an electric leakage detector, and more particularly relates to a DC leakage detector with the ability to detect a DC leakage current and an electric leakage detector including such a DC leakage detector.

BACKGROUND ART

A circuit breaker with the capability of detecting a DC leakage current has been known in the art (see, for example, Patent Literature 1). The circuit breaker of Patent Literature 1 includes a magnetic core, a winding, an excitation unit, a current detection unit, a DC component detection unit, a pair of contacts, and a decision unit. The magnetic core is electromagnetically coupled to a pair of electrically conductive paths through which an alternating current flows. The winding is wound around the magnetic core. The excitation unit supplies an excitation current as an alternating current to the winding. The current detection unit detects a current flowing through the winding. The DC component detection unit detects the magnitude of a DC component from the current detected by the current detection unit. The pair of contacts are respectively arranged on the pair of electrically conductive paths. On finding the magnitude of the DC component detected by the DC component detection unit greater than a threshold value, the decision unit turns the pair of contacts OFF. The decision unit turns the pair of contacts OFF in a state where supply of electricity is cut off.

The excitation unit is a positive feedback oscillator circuit including an operational amplifier, two resistors, and a constant voltage source. The operational amplifier is driven by a single power supply. The voltage value of a DC voltage supplied from the constant voltage source is approximately a half of the supply voltage of the operational amplifier. The inverting input terminal of the operational amplifier is connected to a connection point between the winding and a resistor (current-detecting resistor). The output voltage of the current detection unit (i.e., a voltage at the connection point between the winding and the current-detecting resistor) is supplied to the inverting input terminal of the operational amplifier. The non-inverting input terminal of the operational amplifier receives a threshold voltage, which is obtained by dividing, by two resistors, a differential voltage between the output voltage of the operational amplifier and a DC voltage supplied from the constant voltage source. The output voltage (excitation voltage) of the operational amplifier has its voltage level switching depending on whether the output voltage of the current detection unit (i.e., detection voltage) is greater than, or equal to or less than, the threshold voltage.

If the accuracy of comparison between the output voltage (detection voltage) of the current detection unit and the threshold voltage and the accuracy of the voltage level of the excitation voltage are both low, then the detection accuracy of the DC leakage current could be low. The excitation unit of Patent Literature 1 uses a single operational amplifier to compare the detection voltage with the threshold voltage and to output the excitation voltage. For example, as an input offset voltage of the operational amplifier increases, the timing when the detection voltage reaches the threshold voltage shifts from a timing when the output voltage of the operational amplifier switches its voltage level. That is to say, as the input offset voltage of the operational amplifier increases, the accuracy of comparison between the detection voltage and the threshold voltage decreases. Also, as the ON resistance between a high-side switch and a low-side switch of the operational amplifier increases, the difference between the voltage level of the excitation voltage and either the supply voltage or the ground potential increases, thus decreasing the magnitudes of the excitation voltage and the threshold voltage with respect to the output voltage of the constant voltage source. In other words, as the ON resistance between the high-side switch and low-side switch of the operational amplifier increases, the accuracy of the voltage level of the excitation voltage decreases.

Therefore, to increase the detection accuracy of the DC leakage current, the excitation unit needs to include a high-performance operational amplifier in which the accuracy of comparison between the detection voltage and the threshold voltage and the accuracy of the voltage level of the excitation voltage are both high. This causes a decline in the freedom of selection of parts that form the excitation unit.

CITATION LIST

Patent Literature

Patent Literature 1: WO 2016/170731 A1

SUMMARY OF INVENTION

It is therefore an object of the present invention to provide a DC leakage detector and electric leakage detector with the ability to increase the freedom of selection of parts that form the excitation unit.

A DC leakage detector according to an aspect of the present invention includes a core, an excitation coil, a current-detecting resistor, an excitation unit, and a DC component detection unit. The core allows a plurality of conductors to pass therethrough. The excitation coil is wound around the core. The current-detecting resistor converts a current flowing through the excitation coil into a detection voltage. The excitation unit applies, to the excitation coil, an excitation voltage with a voltage level alternately changing between a high voltage value higher than a reference voltage value and a low voltage value lower than the reference voltage value. The DC component detection unit outputs a DC detection signal representing magnitude of a DC component of the detection voltage. The excitation unit includes a comparison circuit and a voltage switching circuit. The comparison circuit outputs a comparison signal having a voltage level switching between a high level and a low level depending on whether the detection voltage is greater than, or equal to or less than, the threshold voltage. The voltage switching circuit switches the voltage level of the excitation voltage between the high voltage value and the low voltage value according to the voltage level of the comparison signal.

An electric leakage detector according to another aspect of the present invention includes: the DC leakage detector described above; an AC leakage detector to detect an AC leakage current; and an OR circuit configured to calculate a logical sum of a first output signal output from the AC leakage detector and a second output signal output from the DC leakage detector.

DESCRIPTION OF EMBODIMENTS

Figure 1:
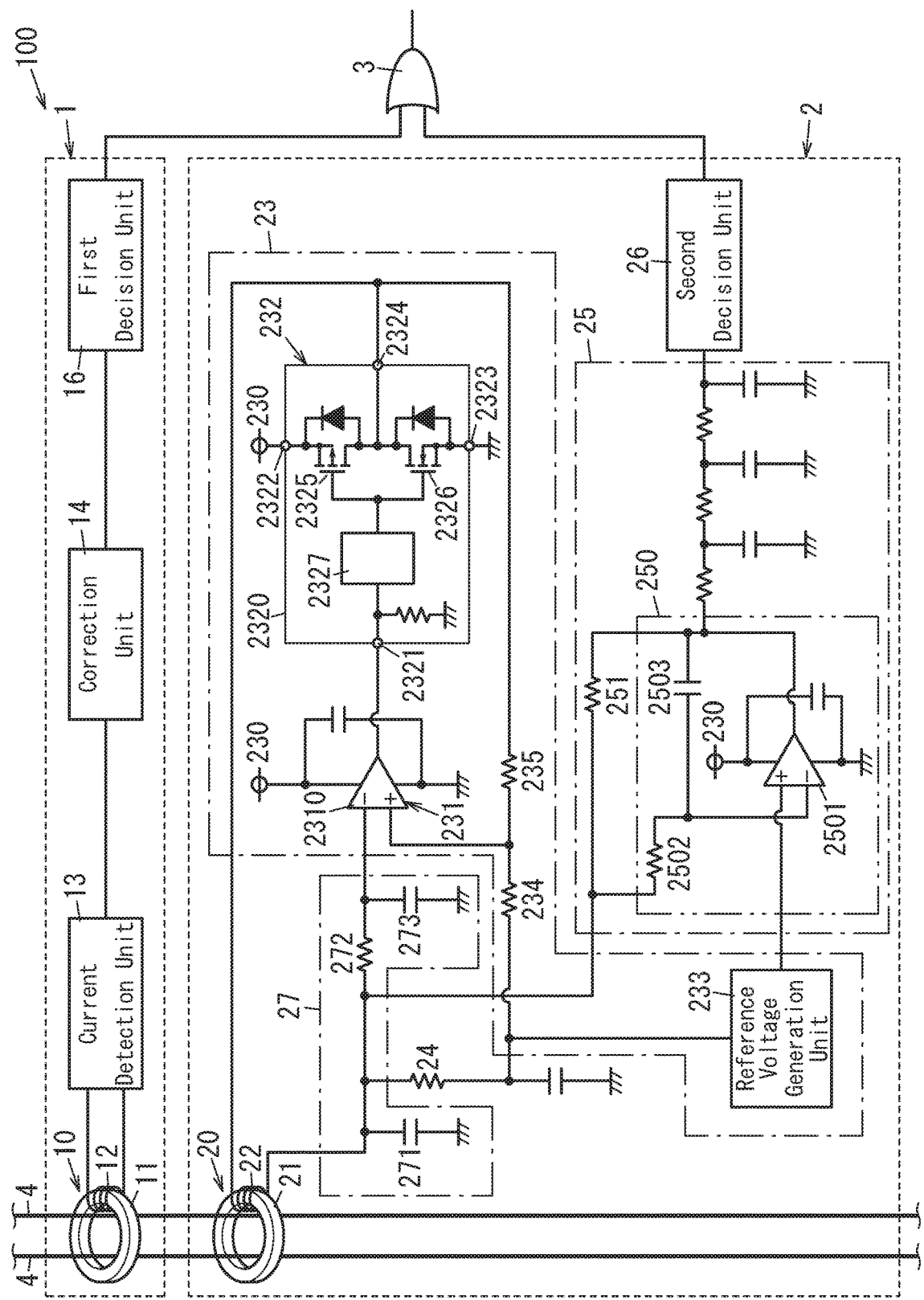
FIG. 1 is a schematic circuit diagram of an electric leakage detector including a DC leakage detector according to an embodiment of the present invention.

An exemplary embodiment of the present invention will be described with reference to the accompanying drawings. Note that the embodiment to be described below is only one of various embodiments of the present invention and should not be construed as limiting. Rather, the embodiment may be readily modified in various manners depending on a design choice or any other factor without departing from a true spirit and scope of the present invention.

Embodiment

A DC leakage detector 2 according to an exemplary embodiment and an electric leakage detector 100 including the DC leakage detector 2 will be described with reference to FIGS. 1-3.

The electric leakage detector 100 may be used, for example, in a charging control unit for charging the rechargeable battery of an electric motor vehicle. Examples of electric motor vehicles include electric vehicles and hybrid vehicles. The charging control unit includes a charging controller, a charging cable, a charging connector (power feeding plug), a power cable, and a power plug. The charging controller is interposed between one end of the power cable and one end of the charging cable to control charging the rechargeable battery of an electric motor vehicle by an external AC power supply (such as a commercial power supply). In this case, the electric motor vehicle includes a DC power supply unit for converting AC power supplied from an AC power supply into DC power to charge a rechargeable battery with the DC power. The charging cable is a cable for electrically connecting the charging controller to the rechargeable battery of the electric motor vehicle. The charging connector is provided for the other end of the charging cable and connected detachably to a charging inlet (charging port) of the electric motor vehicle. The power cable is a cable for electrically connecting the charging controller to an AC power supply. The power plug is provided for the other end of the power cable and connected detachably to an outlet. The charging controller includes a case and a charge circuit interrupt device (CCID) provided for a printed wiring board housed in the case. In the charging control unit, the power cable and the charging cable are extended from the case of the charging controller. The charging controller detects the state of connection of the charging cable to the electric motor vehicle and a charging level of the rechargeable battery in accordance with a control pilot signal input through the charging cable.

In the case of the charging controller, provided are a plurality of (e.g., two) linear conductors 4 (see FIG. 1) that electrically connect the power cable and the charging cable together. Therefore, in the charging control unit, the AC current supplied from the AC power supply to the DC power supply unit of the electric motor vehicle flows through the power cable, the plurality of conductors 4, and the charging cable.

The electric leakage detector 100 forms part of the CCID and implemented on the printed wiring board.

The electric leakage detector 100 includes an AC leakage detector 1 for detecting an AC leakage current in a plurality of (e.g., two) conductors 4, a DC leakage detector 2 for detecting a DC leakage current in a plurality of conductors 4, and an OR circuit 3. The AC leakage detector 1 outputs a first output signal with a signal level switching, depending on the result of detection of the AC leakage current, between a low level and a high level. The signal level of the first output signal is low when the AC leakage detector 1 detects no AC leakage current. The signal level of the first output signal is high when the AC leakage detector 1 detects any AC leakage current. The DC leakage detector 2 outputs a second output signal with a signal level switching, depending on the result of detection of the DC leakage current, between the low level and the high level. The signal level of the second output signal is low when the DC leakage detector 2 detects no DC leakage current. The signal level of the second output signal is high when the DC leakage detector 2 detects any DC leakage current. The OR circuit 3 calculates a logical sum of the first output signal output from the AC leakage detector 1 and the second output signal output from the DC leakage detector 2. Therefore, the output signal of the OR circuit 3 becomes low when the first output signal and the second output signal are both low. The output signal of the OR circuit 3 becomes high when at least one of the first output signal or the second output signal is high.

The AC leakage detector 1 includes a first core 11, a secondary coil 12, a current detection unit 13, a correction unit 14, and a first decision unit 16.

The first core 11 allows a plurality of conductors 4 to pass therethrough. For example, the first core 11 may have a ring shape. In this embodiment, the first core 11 may be implemented as a wound magnetic core, for example. The wound magnetic core is formed by winding a ribbon-shaped (strip-shaped) magnetic member in rolls. The magnetic member is suitably made of a soft magnetic material. In this embodiment, the soft magnetic material may be permalloy, for example.

The first core 11 is housed in a first core case with electrical insulation properties. For example, the first core case may have a hollow ring shape. The first core case is suitably made of a non-magnetic material. Examples of the non-magnetic materials include polybutylene terephthalate (PBT) and polypropylene (PP).

The secondary coil 12 is configured as a copper wire wound around the first core 11. In this case, the copper wire forming the secondary coil 12 is wound around the first core case housing the first core 11. In other words, the copper wire forming the secondary coil 12 is wound around the first core 11 via the first core case.

In the AC leakage detector 1, a first current transformer 10 including the first core 11 and the secondary coil 12 is a zero-phase current transformer for detecting zero-phase currents in the plurality of conductors 4 passed through the first core 11.

The current detection unit 13 outputs a first voltage signal, of which the signal level represents the amplitude of an alternating current flowing through the secondary coil 12. The current detection unit 13 may be implemented as, for example, a current-detecting resistor connected between both ends of the secondary coil 12. The current detection unit 13 converts the alternating current flowing through the secondary coil 12 into the first voltage signal.

A leakage decision threshold for determining whether or not there is any AC leakage current in a CCID is suitably increased as the leakage frequency increases, considering the difference in impact on a human body according to the frequency. In this AC leakage detector 1, the correction unit 14 is provided between the current detection unit 13 and the first decision unit 16 to eliminate the need to change the first threshold value V1 according to the leakage frequency. The first threshold value V1 is used by the first decision unit 16 to determine whether or not there is any AC leakage current. The correction unit 14 is configured to output a corrected first voltage signal by decreasing the signal level of the first voltage signal as the excess of the frequency of the first voltage signal output from the current detection unit 13 over a predetermined frequency (of 100 Hz, for example) increases. In short, the correction unit 14 makes correction by adding a varying weight to the first voltage signal according to the frequency. The correction unit 14 may be implemented as, for example, a low-pass filter provided between the current detection unit 13 and the first decision unit 16.

The first decision unit 16 outputs a first output signal having a signal level switching between a high level and a low level depending on whether the corrected first voltage signal output from the correction unit 14 is greater than, or equal to or less than, the first threshold value V1. That is to say, the first decision unit 16 is a decision circuit for determining, by comparing the corrected first voltage signal output from the correction unit 14 with a preset first threshold value V1, whether or not the corrected first voltage signal has exceeded the first threshold value V1. The first decision unit 16 may be implemented as, for example, a comparator.

When the first decision unit 16 finds the signal level of the corrected first voltage signal output from the correction unit 14 greater than the first threshold value V1, the signal level of the first output signal changes from low level into high level. In this embodiment, in the AC leakage detector 1, the first threshold value V1 for use in the first decision unit 16 is constant irrespective of the leakage frequency. However, providing the correction unit 14 substantially allows the first threshold value V1 to be increased as the leakage frequency increases. In other words, the AC leakage detector 1 sets the frequency-gain characteristic of the correction unit 14 as if the first threshold value V1 for use in the first decision unit 16 increased as the frequency of the AC leakage current rises.

The DC leakage detector 2 is a flux-gate type current sensor. In this embodiment, the DC leakage detector 2 includes a second core 21, an excitation coil 22, an excitation unit 23, a current-detecting resistor 24, a DC component detection unit 25, a second decision unit 26, and a low-pass filter 27.

The second core 21 allows a plurality of conductors 4 to pass therethrough. For example, the second core 21 may have a ring shape. In this embodiment, the second core 21 may be implemented as a wound magnetic core, for example. The wound magnetic core is formed by winding a ribbon-shaped magnetic member in rolls. The magnetic member is suitably made of a soft magnetic material. In this embodiment, the soft magnetic material may be permalloy, for example. The DC leakage detector 2 suitably adopts a permalloy with higher magnetic permeability than a silicon steel sheet as a material for the second core 21.

The second core 21 is housed in a second core case with electrical insulation properties. For example, the second core case may have a hollow ring shape. The second core case is suitably made of a non-magnetic material. Examples of the non-magnetic materials include PBT and PP.

The excitation coil 22 is configured as a copper wire wound around the second core 21. In this embodiment, the copper wire forming the excitation coil 22 is wound around the second core case housing the second core 21. In other words, the copper wire forming the excitation coil 22 is wound around the second core 21 via the second core case.

In the DC leakage detector 2, a second current transformer 20 including the second core 21 and the excitation coil 22 is a DC current transformer for detecting a DC leakage current in the plurality of conductors 4 passed through the second core 21.

In the DC leakage detector 2, the current-detecting resistor 24 is connected in series to the excitation coil 22. Thus, the current flowing through the excitation coil 22 is converted by the current-detecting resistor 24 into a voltage (hereinafter referred to as a "detection voltage Vd"). In other words, the current-detecting resistor 24 converts the current flowing through the excitation coil 22 into the detection voltage Vd and outputs the detection voltage Vd. The detection voltage Vd is a potential at a connection point between the excitation coil 22 and the current-detecting resistor 24 with respect to the ground potential. The magnitude of the detection voltage Vd is proportional to the amount of the current flowing through the excitation coil 22.

One end (first end) of the excitation coil 22 is connected to an output terminal of the excitation unit 23. The other end (second end) of the excitation coil 22 is connected to the current-detecting resistor 24. The second end of the excitation coil 22 is also connected to the input terminal of the excitation unit 23 via a resistor 272 of the low-pass filter 27.

Figure 2A:
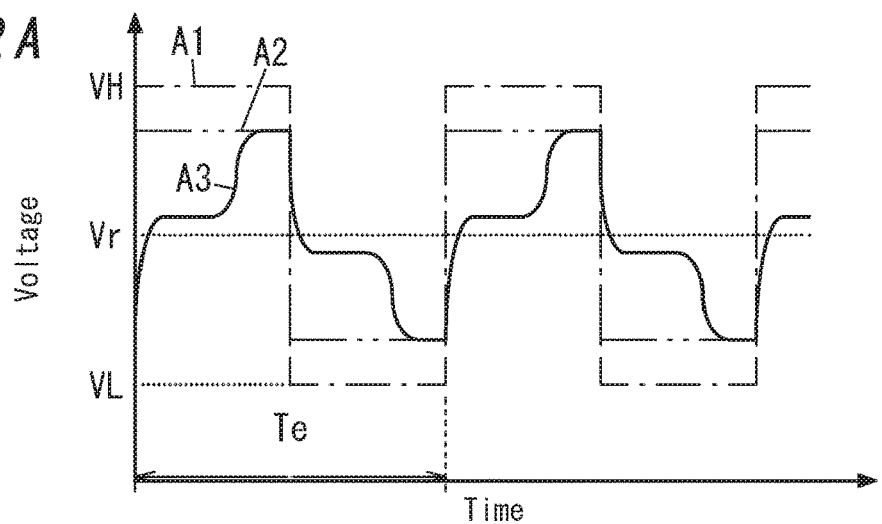
FIG. 2A shows the waveform of a detection voltage in the DC leakage detector.
Figure 2B:
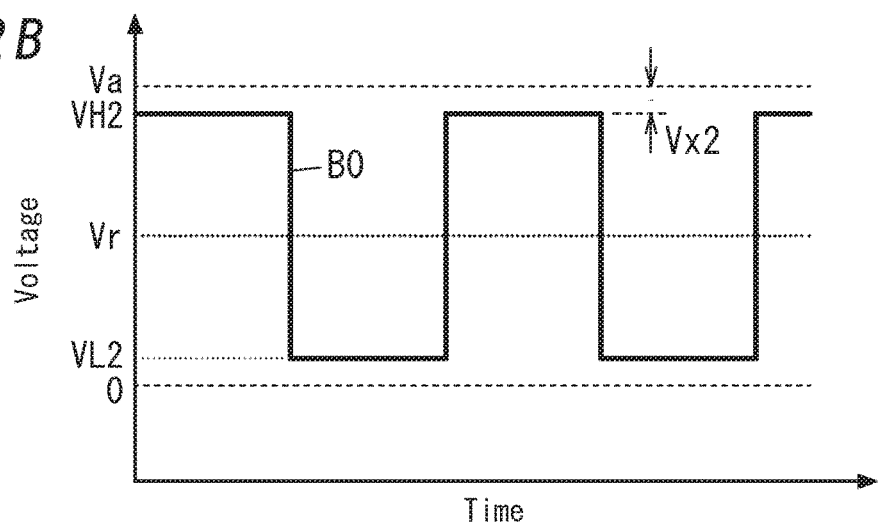
FIG. 2B shows the waveform of a comparison signal in the DC leakage detector.
Figure 2C:
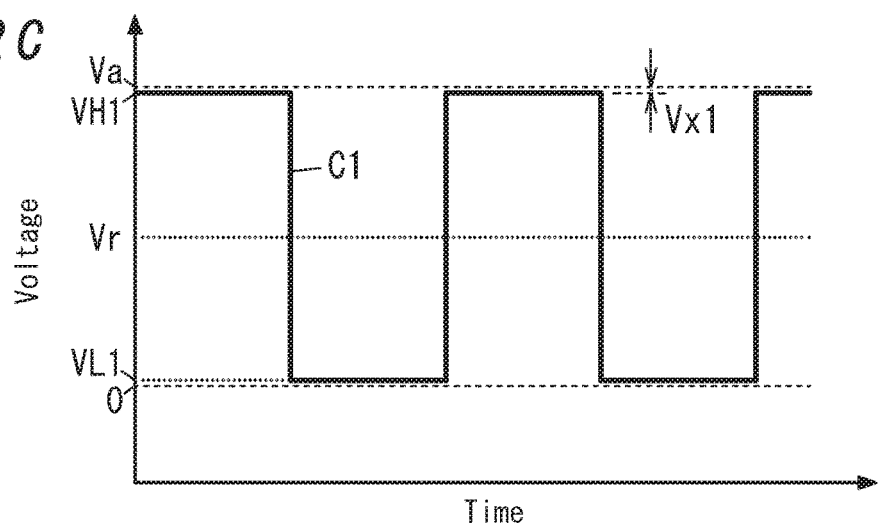
FIG. 2C shows the waveform of an excitation voltage in the DC leakage detector.

The excitation unit 23 is a positive feedback oscillator circuit, and is configured to apply an AC excitation voltage to the excitation coil 22 by performing an oscillation operation. The frequency of the excitation voltage will be hereinafter referred to as an "excitation frequency." The excitation voltage may be a rectangular wave voltage having a voltage level that alternately changes between a first high voltage value VH1 higher than a reference voltage value Vr and a first low voltage value VL1 lower than the reference voltage value Vr as shown in FIG. 2C, for example. The excitation unit 23 changes, based on a result of comparison between the detection voltage Vd output by the current-detecting resistor 24 and the threshold voltage Vth, the voltage level of the excitation voltage alternately between the first high voltage value VH1 and the first low voltage value VL1. The excitation unit 23 supplies an AC excitation current to the excitation coil 22 by applying the excitation voltage to the excitation coil 22. The voltage value of the excitation voltage (i.e., the first high voltage value VH1 or the first low voltage value VL1) and the reference voltage value Vr are set to make the second core 21 magnetically saturated. The excitation frequency may be about 200 Hz to about 300 Hz, for example.

Specifically, the excitation unit 23 includes a comparison circuit 231, a voltage switching circuit 232, a reference voltage generation unit 233, a resistor 234, and a resistor 235.

The comparison circuit 231 includes an operational amplifier 2310 and configured to output a comparison signal having a voltage level switching between a high level and a low level depending on whether the detection voltage Vd is greater than, or equal to or less than, the threshold voltage Vth. The operational amplifier 2310 may be driven with a single power supply and is electrically connected to the control power supply 230 and the ground. The operational amplifier 2310 operates with a supply voltage applied from the control power supply 230. The voltage value Va of the supply voltage (hereinafter referred to as a "supply voltage value") may be 5 V, for example. The ground potential is 0 V.

The operational amplifier 2310 includes a pair of input terminals (consisting of an inverting input terminal and a non-inverting input terminal). The inverting input terminal of the operational amplifier 2310 is connected to a connection point between the excitation coil 22 and the current-detecting resistor 24 via the resistor 272 of the low-pass filter 27 and receives the detection voltage Vd. The non-inverting input terminal of the operational amplifier 2310 is connected to a connection point between the resistors 234 and 235, which are connected in series between the output terminal of the voltage switching circuit 232 and the output terminal of the reference voltage generation unit 233, and receives the threshold voltage Vth.

The operational amplifier 2310 includes a high-side switch and a low-side switch, which are connected in series between the control power supply 230 and the ground. The connection point between the high-side switch and the low-side switch is connected to the output terminal of the operational amplifier 2310. The operational amplifier 2310 switches the voltage level of the comparison signal between the high level and the low level by turning, based on the result of comparison between the detection voltage Vd and the threshold voltage Vth, either the high-side switch or the low-side switch ON. The voltage value of the comparison signal when the voltage level of the comparison signal is high will be hereinafter referred to as a "second high voltage value VH2." The voltage value of the comparison signal when the voltage level of the comparison signal is low will be hereinafter referred to as a "second low voltage value VL2." The output terminal of the operational amplifier 2310 is connected to the voltage switching circuit 232. The operational amplifier 2310 outputs the comparison signal to the voltage switching circuit 232.

The operational amplifier 2310 has a relatively small input offset voltage. The input offset voltage of the operational amplifier 2310 is suitably at most 10 mV, more suitably 5 mV or less, and even more suitably 2 mV or less. The operational amplifier 2310 may be a CMOS operational amplifier NJU77701 (product name) manufactured by New Japan Radio Co., Ltd. Optionally, the comparison circuit 231 may include a comparator instead of the operational amplifier 2310.

The voltage switching circuit 232 is configured to switch, according to the voltage level of the comparison signal, the voltage level of the excitation voltage between the first high voltage value VH1 and the first low voltage value VL1. The voltage switching circuit 232 includes an analog switch 2320 for switching, according to the voltage level of the input voltage, the voltage level of the output voltage. The analog switch 2320 includes an input terminal 2321, a power supply terminal 2322, a ground terminal 2323, and an output terminal 2324. The analog switch 2320 operates with the supply voltage applied from the control power supply 230.

The input terminal 2321 is connected to the output terminal of the comparison circuit 231 (operational amplifier 2310). The output terminal 2324 is connected to the first end of the excitation coil 22. The output terminal 2324 is also connected to the output terminal of the reference voltage generation unit 233 via the series circuit of the resistors 234 and 235. The power supply terminal 2322 is connected to the control power supply 230. The ground terminal 2323 is connected to the ground.

The analog switch 2320 includes a high-side switch 2325 and a low-side switch 2326, which are connected in series between the power supply terminal 2322 and the ground terminal 2323. The high-side switch 2325 is implemented as a p-channel enhancement MOSFET. The low-side switch 2326 is implemented as an n-channel enhancement MOSFET. The source terminal of the high-side switch 2325 is connected to the power supply terminal 2322. The source terminal of the low-side switch 2326 is connected to the ground terminal 2323. The respective drain terminals of the high-side switch 2325 and low-side switch 2326 are connected together. The connection point between the respective drain terminals of the high-side switch 2325 and low-side switch 2326 is connected to the output terminal 2324. The respective gate terminals of the high-side switch 2325 and low-side switch 2326 are connected together.

The analog switch 2320 further includes a control circuit 2327 for controlling the high-side switch 2325 and the low-side switch 2326. The control circuit 2327 is connected to the input terminal 2321. The control circuit 2327 is also connected to the respective gate terminals of the high-side switch 2325 and low-side switch 2326. The control circuit 2327 controls, according to the voltage level of the comparison signal, the respective gate voltages of the high-side switch 2325 and low-side switch 2326. When finding the input voltage greater than the first threshold value (of 2 V, for example) larger than the second low voltage value VL2, the control circuit 2327 determines that the voltage level of the comparison signal has changed from the low level into the high level. On the other hand, when finding the input voltage less than the second threshold value (of 0.8 V, for example) smaller than the second high voltage value VH2, the control circuit 2327 determines that the voltage level of the comparison signal has changed from the high level into the low level.

When the voltage level of the comparison signal is high level, the control circuit 2327 controls the respective gate voltages of the high-side switch 2325 and low-side switch 2326 to turn the high-side switch 2325 ON and turn the low-side switch 2326 OFF. This allows the control power supply 230 and the output terminal 2324 to be electrically connected together via the high-side switch 2325 to make the voltage level of the excitation voltage equal to the first high voltage value VH1.

On the other hand, when the voltage level of the comparison signal is low level, the control circuit 2327 controls the respective gate voltages of the high-side switch 2325 and low-side switch 2326 to turn the high-side switch 2325 OFF and turn the low-side switch 2326 ON. This allows the output terminal 2324 and the ground to be electrically connected together via the low-side switch 2326 to make the voltage level of the excitation voltage equal to the first low voltage value VL1.

The analog switch 2320 is suitably an analog switch, of which the high-side switch 2325 and low-side switch 2326 both have low ON resistance. The high-side switch 2325 and low-side switch 2326 of the analog switch 2320 suitably have an ON resistance of 5Ω or less. In the analog switch 2320, the difference in ON resistance between the high-side switch 2325 and the low-side switch 2326 is suitably as small as possible. The analog switch 2320 may be implemented as, for example, a gate driver NJW4841-T1 (product name) manufactured by New Japan Radio Co., Ltd. Alternatively, the analog switch 2320 may also be implemented as any element other than a gate driver.

The reference voltage generation unit 233 is a constant voltage circuit and outputs a reference voltage, of which the voltage value is the reference voltage value Vr. The reference voltage value Vr is approximately a half of the supply voltage value Va of the supply voltage output from the control power supply 230. That is to say, when the supply voltage value Va is 5 V, the reference voltage value Vr is 2.5 V.

The output terminal of the reference voltage generation unit 233 is connected to the output terminal 2324 of the voltage switching circuit 232 (analog switch 2320) via the series circuit of the resistors 234 and 235. A voltage obtained by dividing the differential voltage between the voltage level of the excitation voltage output from the voltage switching circuit 232 and the reference voltage value Vr by the resistance of the two resistors 234 and 235 is input, as the threshold voltage Vth, to the non-inverting input terminal of the operational amplifier 2310. As described above, the excitation voltage has a voltage level alternately changing between the first high voltage value VH1 higher than the reference voltage value Vr and the first low voltage value VL1 lower than the reference voltage value Vr. Therefore, the voltage value of the threshold voltage Vth alternately changes, according to the variation in the voltage level of the excitation voltage, between a value higher than the reference voltage value Vr and a value lower than the reference voltage value Vr (as indicated by the two-dot chain A2 in FIG. 2A). That is to say, the voltage value of the threshold voltage Vth becomes higher than the reference voltage value Vr when the voltage level of the excitation voltage is the first high voltage value VH1 and becomes lower than the reference voltage value Vr when the voltage level of the excitation voltage is the first low voltage value VL1.

In addition, the output terminal of the reference voltage generation unit 233 is also connected to a second end of the excitation coil 22 via the current-detecting resistor 24. Therefore, when the voltage level of the excitation voltage is the first high voltage value VH1 higher than the reference voltage value Vr, a current flows from the voltage switching circuit 232 toward the reference voltage generation unit 233 through the excitation coil 22 and the current-detecting resistor 24. On the other hand, when the voltage level of the excitation voltage is the first low voltage value VL1 lower than the reference voltage value Vr, a current flows from the reference voltage generation unit 233 toward the voltage switching circuit 232 through the current-detecting resistor 24 and the excitation coil 22.

The detection voltage Vd obtained through conversion by the current-detecting resistor 24 is input to the inverting input terminal of the operational amplifier 2310. The voltage value of the detection voltage Vd is proportional to the excitation current. When no DC leakage current flows through the conductors 4, the excitation current has a current waveform, which is substantially symmetric in its positive and negative domains. Therefore, the voltage waveform of the detection voltage Vd comes to have a shape that is substantially symmetric with respect to the reference voltage value Vr (as indicated by the solid curve A3 in FIG. 2A). On the other hand, when a DC leakage current flows through the conductors 4, the excitation current has a current waveform, which is asymmetric in its positive and negative domains due to the magnetic field generated by the DC leakage current (see FIG. 3). That is to say, when a DC leakage current flows through the conductors 4, a DC component is produced in the detection voltage Vd. The operation of the excitation unit 23 and the variation in the excitation current will be described in further detail after the OR circuit 3 has been described.

The DC component detection unit 25 outputs a DC detection signal (hereinafter referred to as a "second voltage signal") representing the magnitude of the DC component of the detection voltage Vd. In other words, the DC component detection unit 25 outputs a second voltage signal having a voltage level proportional to the DC component of the leakage current flowing through the conductors 4. Therefore, the output voltage of the DC component detection unit 25 is proportional to the magnitude of the DC component included in the current value detected by the current-detecting resistor 24.

The DC component detection unit 25 includes an integration circuit 250 and a feedback resistor 251. The integration circuit 250 includes an operational amplifier 2501, a resistor 2502, one terminal of which is connected to the inverting input terminal of the operational amplifier 2501, and a capacitor 2503 connected between the inverting input terminal and output terminal of the operational amplifier 2501. The integration circuit 250 is configured to receive the reference voltage with the reference voltage value Vr at the non-inverting input terminal of the operational amplifier 2501 and also receive, via the resistor 2502, the detection voltage Vd obtained through conversion by the current-detecting resistor 24. The feedback resistor 251 is connected between the output terminal of the integration circuit 250 and the other terminal of the resistor 2502.

The second decision unit 26 outputs a second output signal having a signal level switching between a high level and a low level depending on whether the second voltage signal output from the DC component detection unit 25 is greater than, or equal to or less than, the second threshold value V2. The second decision unit 26 includes a comparison circuit including a comparator, for example. In the second decision unit 26, when the second voltage signal output from the DC component detection unit 25 exceeds the second threshold value V2, the signal level of the second output signal changes from the low level into the high level.

The low-pass filter 27 includes a capacitor 271, a resistor 272, and a capacitor 273. In this embodiment, in the low-pass filter 27, one terminal of the resistor 272 is connected to the excitation coil 22, and the other terminal of the resistor 272 is connected to the input terminal of the excitation unit 23. In other words, in the low-pass filter 27, the resistor 272 is provided between the input terminal, connected to the connection point between the excitation coil 22 and the current-detecting resistor 24, of the excitation unit 23 and the excitation coil 22. In addition, in the low-pass filter 27, one terminal of the capacitor 271 is connected to the connection point between the excitation coil 22 and the resistor 272, and the other terminal of the capacitor 271 is connected to the ground. Furthermore, in the low-pass filter 27, one terminal of the capacitor 273 is connected to the connection point between the resistor 272 and the input terminal of the excitation unit 23, and the other terminal of the capacitor 273 is connected to the ground. This allows high frequency components of a current flowing from the excitation coil 22 into the low-pass filter 27 (i.e., components with frequencies higher than the cutoff frequency) to flow through either the capacitor 271 or the capacitor 273.

The OR circuit 3 calculates a logical sum of a first output signal output from the AC leakage detector 1 and a second output signal output from the DC leakage detector 2. Therefore, in the electric leakage detector 100, if the first output signal output from the AC leakage detector 1 and the second output signal output from the DC leakage detector 2 are both low, then the output signal of the OR circuit 3 becomes low. Meanwhile, in the electric leakage detector 100, if at least one of the first output signal output from the AC leakage detector 1 or the second output signal output from the DC leakage detector 2 is high, then the output signal of the OR circuit 3 becomes high.

The CCID described above is configured to cut off, when receiving a high level output signal from the OR circuit 3, the supply of power from the AC power supply to the DC power supply unit. This allows the CCID to cut off, when an error such as electricity leakage occurs, the supply of power from the AC power supply to the DC power supply unit. On the other hand, when receiving a low level output signal from the OR circuit 3, the CCID does not cut off the supply of power from the AC power supply to the DC power supply unit.

Next, it will be described in detail with reference to FIGS. 2A-3 how the excitation unit 23 operates. In FIG. 2A, the waveform of the excitation voltage output from the analog switch 2320 (voltage switching circuit 232) is indicated by the one-dot chain A1. Also, in FIG. 2A, the waveform of the threshold voltage Vth applied to the non-inverting input terminal of the operational amplifier 2310 is indicated by the two-dot chain A2 and the waveform of the detection voltage Vd applied to the inverting input terminal of the operational amplifier 2310 is indicated by the solid curve A3. In FIG. 2B, the waveform of the comparison signal output by the operational amplifier 2310 (comparison circuit 231) is indicated by the solid line BO. In FIG. 2C, the waveform of the excitation voltage output by the analog switch 2320 (voltage switching circuit 232) is indicated by the solid line C1. In FIG. 3, the waveform of the excitation current in a situation where a DC leakage current is flowing through the conductors 4 is indicated by the solid curve D3.

In the DC leakage detector 2, the second core 21 is magnetically saturated every half cycle of the excitation voltage. Therefore, a steep current pulse waveform appears every half cycle in the waveform of the excitation current (which is represented, in FIG. 2A, by the waveform of the detection voltage Vd obtained by converting the excitation current). One cycle Te of the excitation current (excitation voltage) is given by 1/fe, where fe is the excitation frequency.

If no DC leakage current is flowing through the conductors 4, a steep current pulse waveform appears at an interval corresponding to a half cycle of the excitation current. In a situation where no DC leakage current is flowing through the conductors 4, if the waveform representing the excitation current with positive polarity has its phase shifted by 7C [radians], then the waveform representing one cycle of the excitation current with positive polarity should ideally be substantially symmetric to the waveform representing one cycle of the excitation current with negative polarity. The impedance of the excitation coil 22 is determined by the resistance, inductance, capacitance, and angular frequency of the excitation coil 22. However, the inductance is proportional to the relative permeability. Therefore, when the second core 21 is magnetically saturated, the impedance of the excitation coil 22 decreases steeply. In short, in the DC leakage detector 2, when the second core 21 is magnetically saturated, the impedance of the excitation coil 22 decreases so steeply that the amount of the current flowing through the excitation coil 22 increases steeply.

The current flowing through the excitation coil 22 is converted by the current-detecting resistor 24 into the detection voltage Vd. The operational amplifier 2310 compares the detection voltage Vd with the threshold voltage Vth. When finding the detection voltage Vd has reached the threshold voltage Vth, the operational amplifier 2310 changes the voltage level of the comparison signal between the high level and the low level (see FIG. 2B). The operational amplifier 2310 has a relatively small input offset voltage. Therefore, the operational amplifier 2310 is able to switch the voltage level of the comparison signal at approximately the same timing as the time when the detection voltage Vd reaches the threshold voltage Vth. Thus, it can be said that the comparison circuit 231 (operational amplifier 2310) has the ability to compare the detection voltage Vd with the threshold voltage Vth relatively accurately. Also, the second high voltage value VH2 when the voltage level of the comparison signal is high is lower than the supply voltage value Va due to a voltage drop caused by the ON resistance of the high-side switch that the operational amplifier 2310 includes. On the other hand, the second low voltage value VL2 when the voltage level of the comparison signal is low is higher than the ground potential (of 0 V) due to a voltage rise caused by the ON resistance of the low-side switch that the operational amplifier 2310 includes.

The analog switch 2320 switches, as the voltage level of the comparison signal varies, the voltage level of the excitation voltage between the first high voltage value VH1 and the first low voltage value VL1 (see FIG. 2C). The excitation voltage ideally has its voltage levels defined such that the first high voltage value VH1 is equal to the supply voltage value Va and that the first low voltage value VL1 is equal to the ground potential. Actually, however, the first high voltage value VH1 becomes lower than the supply voltage value Va due to the voltage drop caused by the ON resistance of the high-side switch 2325. The first low voltage value VL1 becomes higher than the ground potential (of 0 V) due to a voltage rise caused by the ON resistance of the low-side switch 2326. In other words, the voltage between both terminals (i.e., the drain-source voltage) of the low-side switch 2326 becomes the first low voltage value VL1.

In this case, the ON resistance of the high-side switch 2325 included in the analog switch 2320 has smaller resistance value than the ON resistance of the high-side switch included in the operational amplifier 2310. Therefore, a first difference Vx1 between the supply voltage value Va and the first high voltage value VH1 is less than a second difference Vx2 between the supply voltage value Va and the second high voltage value VH2 (i.e., Vx1<Vx2). In other words, the first high voltage value VH1 is greater than the second high voltage value VH2 (i.e., VH1>VH2). Also, the ON resistance of the low-side switch 2326 included in the analog switch 2320 has smaller resistance value than the ON resistance of the low-side switch included in the operational amplifier 2310. Therefore, the first low voltage value VL1 is less than the second low voltage value VL2 (i.e., VL1<VL2). That is to say, in the excitation voltage output by the voltage switching circuit 232 (analog switch 2320), the difference (first difference Vx1) between the first high voltage value VH1 and the supply voltage value Va and the difference between the first low voltage value VL1 and the ground potential are relatively insignificant. Therefore, it can be said that the voltage switching circuit 232 (analog switch 2320) has relatively accurate voltage levels of the excitation voltage. Thus, the excitation voltage and the threshold voltage each have a generally symmetric voltage waveform with respect to the reference voltage value Vr (see FIGS. 2A and 2C).

When the voltage level of the comparison signal output by the operational amplifier 2310 exceeds a first threshold value greater than the second low voltage value VL2, the analog switch 2320 sets the voltage level of the excitation voltage at the first high voltage value VH1. When the voltage level of the comparison signal output by the operational amplifier 2310 becomes less than a second threshold value less than the second high voltage value VH2, the analog switch 2320 sets the voltage level of the excitation voltage at the first low voltage value VL1. Therefore, even if there is a significant difference between the signal level of the comparison signal output by the operational amplifier 2310 and the supply voltage value Va or the ground potential, the accuracy of the voltage level of the excitation voltage is not affected significantly.

As can be seen, in the excitation unit 23, the voltage level of the comparison signal changes almost at the same timing as when the detection voltage Vd reaches the threshold voltage Vth. The variation in the voltage level of the comparison signal causes the polarity of the excitation voltage to be inverted with respect to the reference voltage value Vr. Therefore, the excitation current becomes a non-sinusoidal alternating current.

When no DC leakage current is flowing through the conductors 4, the excitation current has a current waveform which is symmetric in the positive and negative domains. Therefore, the voltage waveform of the detection voltage Vd comes to have a symmetric shape with respect to the reference voltage value Vr (as indicated by the solid curve A3 in FIG. 2A). When no DC leakage current is flowing through the conductors 4, the DC components included in the excitation current are zero.

Figure 3:
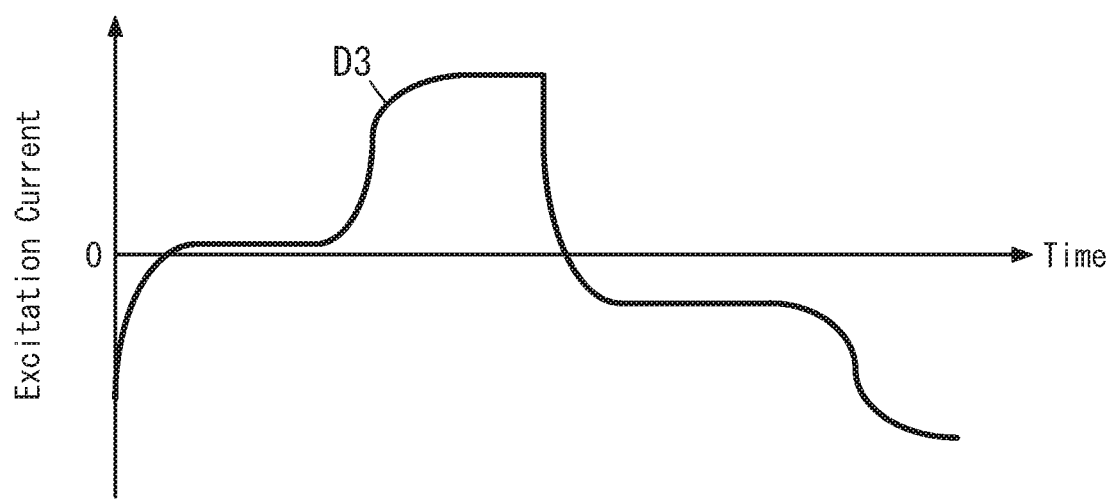
FIG. 3 shows the waveform of an excitation current in the DC leakage detector.

On the other hand, when a DC leakage current is flowing through the conductors 4, the excitation current has a current waveform, which is asymmetric in its positive and negative domains due to the magnetic field generated by the DC leakage current (see FIG. 3). In the example illustrated in FIG. 3, when the excitation current flows in a positive direction, the magnetic flux generated by the DC leakage current has the same orientation as the magnetic flux generated by the excitation current. Therefore, when a DC leakage current is flowing through the conductors 4, the excitation coil 22 becomes magnetically saturated (i.e., the excitation current becomes magnetically saturated) earlier than in a situation where no DC leakage current is flowing through the conductors 4. Also, in the example illustrated in FIG. 3, when the excitation current flows in a negative direction, the magnetic flux generated by the DC leakage current has the opposite orientation from the magnetic flux generated by the excitation current. Therefore, when a DC leakage current is flowing through the conductors 4, the excitation coil 22 becomes magnetically saturated later than in a situation where no DC leakage current is flowing through the conductors 4. When a DC leakage current is flowing through the conductors 4, a DC component is generated in not only the excitation current but also the detection voltage Vd proportional to the excitation current as well. The DC leakage current described above may flow, for example, from the DC power supply unit into the conductors 4 via a grounding point of the AC power supply. When a DC leakage current is flowing through the conductors 4, the current waveform in one cycle of the excitation current comes to have an asymmetric shape in the positive and negative domains with respect to a zero crossing point.

Next, variations of the DC leakage detector 2 according to this embodiment will be described.

Figure 4:
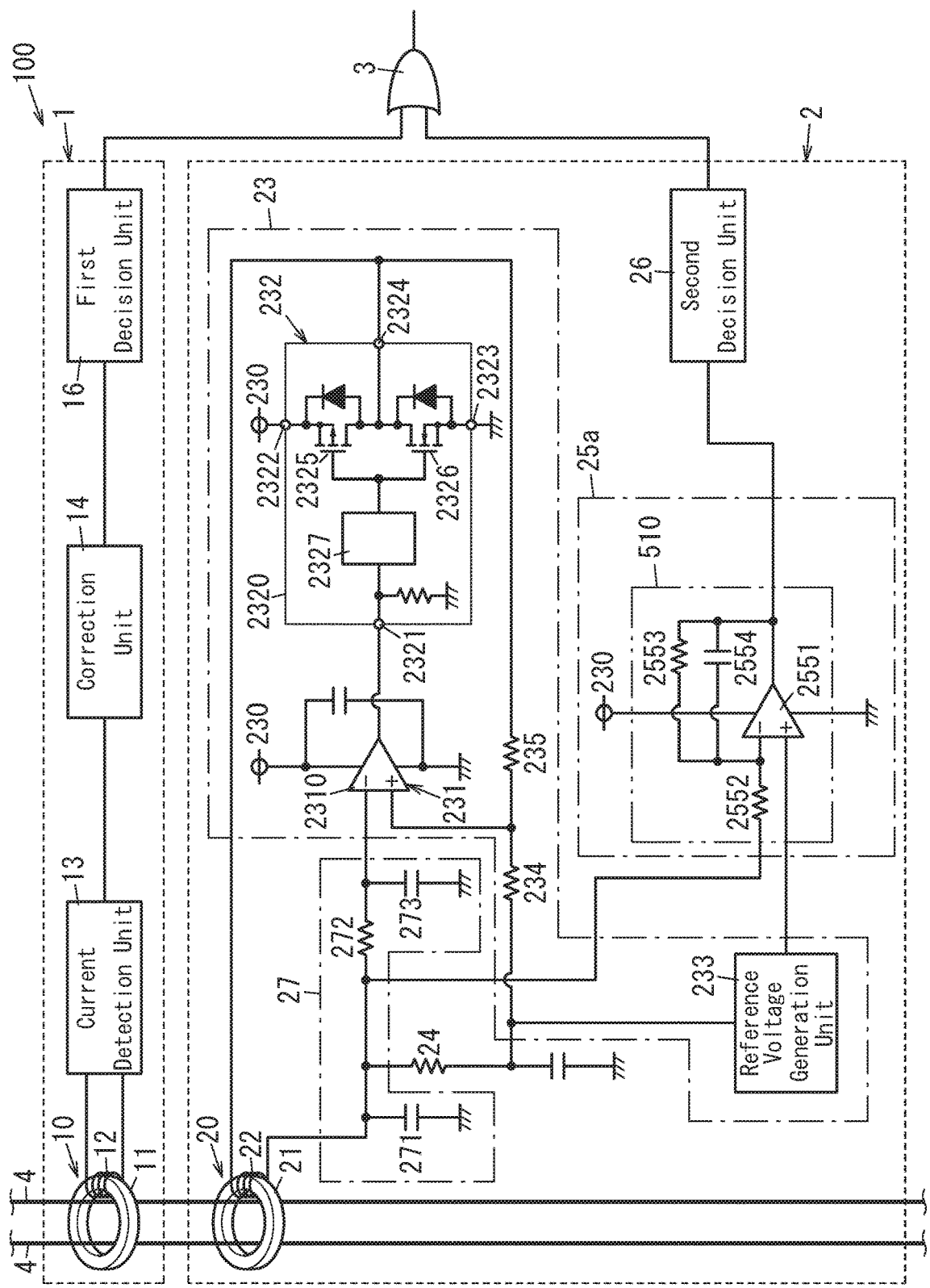
FIG. 4 is a schematic circuit diagram of an electric leakage detector including a DC leakage detector according to a variation of the embodiment of the present invention.

The DC leakage detector 2 may include, instead of the DC component detection unit 25, an alternative DC component detection unit 25a including a low-pass filter 510 with an operational amplifier 2551 as shown in FIG. 4.

The DC component detection unit 25a includes the operational amplifier 2551, two resistors 2552 and 2553, and a capacitor 2554. In the DC component detection unit 25a, the non-inverting input terminal of the operational amplifier 2551 is connected to the reference voltage generation unit 233. This allows the DC component detection unit 25a to receive a reference voltage with the reference voltage value Vr at the non-inverting input terminal of the operational amplifier 2551. In addition, in the DC component detection unit 25a, the inverting input terminal of the operational amplifier 2551 is connected to a connection point between the current-detecting resistor 24 and the excitation coil 22 via the resistor 2552. This allows the DC component detection unit 25a to receive, via the resistor 2552, the voltage obtained through conversion by the current-detecting resistor 24 at the inverting input terminal of the operational amplifier 2551. Furthermore, in the DC component detection unit 25a, a parallel circuit of the resistor 2553 and the capacitor 2554 is connected between the output terminal and inverting input terminal of the operational amplifier 2551.

The DC component detection unit 25a outputs a DC component included in the detection voltage Vd to the second decision unit 26 by attenuating high frequency components included in the detection voltage Vd. In this embodiment, the voltage signal output from the DC component detection unit 25a comes to have a voltage value proportional to the amount of the DC leakage current flowing through the conductors 4.

In the embodiment described above, the supply voltage applied to the analog switch 2320 has a positive supply voltage value Va (of 5V, for example). However, this is only an example and should not be construed as limiting. Alternatively, the supply voltage applied to the analog switch 2320 may also have a negative supply voltage value (of −5 V, for example). In that case, the first high voltage value VH1 is approximately 0 V, the first low voltage value VL1 is approximately −5 V, and the reference voltage value Vr is −2.5 V. Still alternatively, the supply voltage applied to the analog switch 2320 may also have a positive supply voltage value (of 3.3 V, for example) and a negative supply voltage value (of −3.3 V, for example) in combination. In that case, the first high voltage value VH1 is approximately 3.3 V, the first low voltage value VL1 is approximately −3.3 V, and the reference voltage value Vr is 0 V.

Furthermore, in the embodiment described above, the supply voltage is applied from the same control power supply 230 to the analog switch 2320 and the operational amplifier 2310. However, this is only an example and should not be construed as limiting. Alternatively, two different supply voltages may be applied thereto from two different power supplies. Also, the voltage value of the supply voltage applied to the analog switch 2320 and the voltage value of the supply voltage applied to the operational amplifier 2310 may be different from each other.

As can be seen from the foregoing description, a DC leakage detector 2 according to a first aspect includes a second core 21 (core), an excitation coil 22, a current-detecting resistor 24, an excitation unit 23, and a DC component detection unit 25 (25a). The second core 21 allows a plurality of conductors 4 to pass therethrough. The excitation coil 22 is wound around the second core 21. The current-detecting resistor 24 converts a current flowing through the excitation coil 22 into a detection voltage Vd. The excitation unit 23 applies, to the excitation coil 22, an excitation voltage with a voltage level alternately changing between a first high voltage value VH1 higher than a reference voltage value Vr and a first low voltage value VL1 lower than the reference voltage value Vr. The DC component detection unit 25 (25*a*) outputs a DC detection signal representing magnitude of a DC component of the detection voltage Vd. The excitation unit 23 includes a comparison circuit 231 and a voltage switching circuit 232. The comparison circuit 231 outputs a comparison signal having a voltage level switching between a high level and a low level depending on whether the detection voltage Vd is greater than, or equal to or less than, the threshold voltage Vth. The voltage switching circuit switches the voltage level of the excitation voltage between the first high voltage value VH1 and the first low voltage value VL1 according to the voltage level of the comparison signal.

In a DC leakage detector 2 with such a configuration, the comparison circuit 231 compares the detection voltage Vd with the threshold voltage Vth, and the voltage switching circuit 232 switches the voltage level of the excitation voltage. Therefore, configuring the comparison circuit 231 to at least increase the accuracy of comparison between the detection voltage Vd and the threshold voltage Vth and configuring the voltage switching circuit 232 to at least increase the accuracy of the voltage level of the excitation voltage would improve the detection accuracy of a DC leakage current. This allows the DC leakage detector 2 to increase the freedom of selection of parts that form the excitation unit 23. In addition, increasing the freedom of selection of parts that form the excitation unit 23 also allows the DC leakage detector 2 to reduce the cost of those parts that form the excitation unit 23.

When adopted in a CCID, the DC leakage detector 2 is also expected to be used outdoors, and therefore, suitably has a wide operating temperature range. In the excitation unit 23 of the DC leakage detector 2, the comparison circuit 231 is required to be able to compare the detection voltage Vd with the threshold value Vth highly accurately and the voltage switching circuit 232 is required to be able to switch the voltage level of the excitation voltage highly accurately, to say the least. This allows the DC leakage detector 2 to deal with a wide operating temperature range.

In a DC leakage detector 2 according to a second aspect, which may be implemented in conjunction with the first aspect, the comparison circuit 231 is suitably implemented as either an operational amplifier 2310 or a comparator. The comparison circuit 231 suitably receives the detection voltage Vd at one of two input terminals thereof (consisting of an inverting input terminal and a non-inverting input terminal) and also receives the threshold voltage Vth at the other of the two input terminals thereof. The voltage switching circuit 232 is suitably implemented as an analog switch 2320 and suitably receives the comparison signal.

This configuration allows the DC leakage detector 2 to simplify the configurations of the comparison circuit 231 with the ability to compare the detection voltage Vd with the threshold value Vth highly accurately and the voltage switching circuit 232 with the ability to switch the voltage level of the excitation voltage highly accurately.

In a DC leakage detector 2 according to a third aspect, which may be implemented in conjunction with the second aspect, the comparison circuit 231 and the voltage switching circuit 232 are suitably each electrically connected to a control power supply 230 and a ground and suitably receive a supply voltage from the control power supply 230. The analog switch 2320 suitably includes: a high-side switch 2325 electrically connected between the control power supply 230 and an output terminal 2324; and a low-side switch 2326 electrically connected between the ground and the output terminal 2324. A first difference Vx1 between a first high voltage value VH1 and a supply voltage value Va of the supply voltage is suitably less than a second difference Vx2 between a second high voltage value VH2 as the voltage value of the comparison signal when the comparison signal is high level and the supply voltage value Va of the supply voltage. A first low voltage value VL1 is suitably less than a second low voltage value VL2 as the voltage value of the comparison signal when the comparison signal is low level.

This configuration allows the DC leakage detector 2 to switch the voltage level of the excitation voltage more accurately, thus improving the detection accuracy of a DC leakage current.

In a DC leakage detector 2 according to a fourth aspect, which may be implemented in conjunction with any one of the first to third aspects, the DC component detection unit 25*a* suitably includes a low-pass filter 510.

This configuration allows the DC leakage detector 2 to simplify the configuration of the DC component detection unit 25*a*.

In a DC leakage detector 2 according to a fifth aspect, which may be implemented in conjunction with any one of the first to third aspects, the DC component detection unit 25 suitably includes: a feedback resistor 251; and an integration circuit 250 including an operational amplifier 2501.

This configuration allows the DC leakage detector 2 to stabilize the output level of the DC component detection unit 25 without depending on the dispersion between individual second cores 21 or the temperature characteristic.

An electric leakage detector 100 according to a sixth aspect includes: the DC leakage detector 2 according to any one of the first to fifth aspects; an AC leakage detector 1 to detect an AC leakage current; and an OR circuit 3. The OR circuit 3 calculates a logical sum of a first output signal output from the AC leakage detector 1 and a second output signal output from the DC leakage detector 2.

This configuration allows the electric leakage detector 100 to increase the freedom of selection of parts that form the excitation unit 23 of the DC leakage detector 2. In addition, this also allows the electric leakage detector 100 to detect both a DC leakage current and an AC leakage current in conductors 4.

Note that the configuration of the AC leakage detector 1 shown in FIG. 1 is only an example. Rather the AC leakage detector 1 may have any other configuration. Also, the DC leakage detector 2 may also be configured to include no low-pass filters 27.

REFERENCE SIGNS LIST

100 Electric Leakage Detector
1 AC Leakage detector
2 DC Leakage detector
21 Second Core (Core)
22 Excitation Coil
23 Excitation Unit
230 Control Power Supply
231 Comparison Circuit
2310 Operational Amplifier
232 Voltage Switching Circuit
2320 Analog Switch
2324 Output Terminal 2325 High-Side Switch
2326 Low-Side Switch
24 Current-detecting resistor
25, 25a DC Component Detection Unit
250 Integration Circuit 2501 Operational Amplifier
251 Feedback Resistor
510 Low-Pass Filter
3 OR Circuit
4 Conductor
Vr Reference Voltage Value
VH1 First High Voltage Value (High Voltage Value)
VL1 First Low Voltage Value (Low Voltage Value)
VH2 Second High Voltage Value
VL2 Second Low Voltage Value
Vx1 First Difference
Vx2 Second Difference

The invention claimed is:

1. A DC leakage detector comprising:
a core configured to allow a plurality of conductors to pass therethrough;
an excitation coil wound around the core;
a current-detecting resistor configured to convert a current flowing through the excitation coil into a detection voltage;
an excitation unit configured to apply, to the excitation coil, an excitation voltage with a voltage level alternately changing between a high voltage value higher than a reference voltage value and a low voltage value lower than the reference voltage value; and
a DC component detection unit configured to output a DC detection signal representing magnitude of a DC component of the detection voltage,
the excitation unit including:
a comparison circuit configured to output a comparison signal having a voltage level switching between a high level and a low level depending on whether the detection voltage is greater than, or equal to or less than, the threshold voltage; and
a voltage switching circuit configured to switch, according to the voltage level of the comparison signal, the voltage level of the excitation voltage between the high voltage value and the low voltage value,
the voltage switching circuit being configured to be electrically connected to a control power supply and a ground and receive a supply voltage from the control power supply,
the voltage switching circuit including: a high-side switch electrically connected between the control power supply and an output terminal; and a low-side switch electrically connected between the ground and the output terminal,
a difference between a first high voltage value and a voltage value of the supply voltage being less than a difference between a second high voltage value and the voltage value of the supply voltage, where the first high voltage value is the high voltage value, and the second high voltage value is the voltage value of the comparison signal when the comparison signal is high level, and
a first low voltage value being less than a second low voltage value, where the first low voltage value is the low voltage value, and the second low voltage value is the voltage value of the comparison signal when the comparison signal is low level.

2. The DC leakage detector of claim 1, wherein
the comparison circuit is implemented as either an operational amplifier or a comparator, the comparison circuit receiving the detection voltage at one of two input terminals thereof and also receiving the threshold voltage at the other of the two input terminals thereof, and
the voltage switching circuit is implemented as an analog switch and receives the comparison signal.

3. The DC leakage detector of claim 2, wherein
the comparison circuit is electrically connected to the control power supply and the ground and receives the supply voltage from the control power supply.

4. The DC leakage detector of claim 1, wherein
the DC component detection unit includes a low-pass filter.

5. The DC leakage detector of claim 1, wherein
the DC component detection unit includes: a feedback resistor; and an integration circuit including an operational amplifier.

6. An electric leakage detector comprising:
the DC leakage detector of claim 1 configured to output a second output signal;
an AC leakage detector configured to detect an AC leakage current and output a first output signal; and
an OR circuit configured to calculate a logical sum of the first output signal output from the AC leakage detector and the second output signal output from the DC leakage detector.

* * * * *